United States Patent
Sievert et al.

(10) Patent No.: US 10,018,655 B2
(45) Date of Patent: Jul. 10, 2018

(54) CIRCUIT ARRANGEMENT AND METHOD FOR CURRENT MEASUREMENT

(71) Applicant: Robert Bosch GmbH, Stuttgart (DE)

(72) Inventors: Holger Sievert, Ludwigsburg (DE); Stefan Butzmann, Schalksmühle (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 15/117,511

(22) PCT Filed: Dec. 19, 2014

(86) PCT No.: PCT/EP2014/078663
§ 371 (c)(1),
(2) Date: Aug. 9, 2016

(87) PCT Pub. No.: WO2015/120935
PCT Pub. Date: Aug. 20, 2015

(65) Prior Publication Data
US 2016/0349289 A1     Dec. 1, 2016

(30) Foreign Application Priority Data
Feb. 13, 2014 (DE) .......................... 10 2014 202 611

(51) Int. Cl.
*G01R 1/20* (2006.01)
*G01R 15/14* (2006.01)
(Continued)

(52) U.S. Cl.
CPC ....... *G01R 15/146* (2013.01); *G01R 19/0092* (2013.01); *H03K 17/0828* (2013.01); *H03K 17/56* (2013.01); *H03K 2217/0027* (2013.01)

(58) Field of Classification Search
CPC .............. G01R 15/146; G01R 19/0092; H03K 17/0828; H03K 17/56; H03K 2217/0027
(Continued)

(56) References Cited

U.S. PATENT DOCUMENTS

| | | | | |
|---|---|---|---|---|
| 5,061,863 A | * | 10/1991 | Mori | ...................... H01L 23/647 327/362 |
| RE34,107 E | * | 10/1992 | Wirth | ................. H03K 17/0828 323/276 |

(Continued)

FOREIGN PATENT DOCUMENTS

| | | |
|---|---|---|
| DE | 102008059853 | 6/2010 |
| EP | 0743751 A2 * | 11/1996 ......... H03K 17/0828 |

(Continued)

OTHER PUBLICATIONS

Storr, Wayne., Monostable Multivibrator, www.electronics-tutorials.ws, wayback date of Sep. 23, 2013.*

(Continued)

*Primary Examiner* — Jermele M Hollington
*Assistant Examiner* — Sean Curtis
(74) *Attorney, Agent, or Firm* — Michael Best & Friedrich LLP

(57) ABSTRACT

The invention relates to a circuit arrangement having a switching device (1) which is designed to provide a first voltage ($U_E$) and a first electrical current ($I_E$) in a power path and to provide a second voltage ($U_S$) and a second electrical current ($I_S$) in a measuring path for the duration of a switching period, wherein the first electrical current corresponds to the second electrical current; having a current measuring apparatus (2) which is arranged in the measuring path and is designed to provide an output signal ($U_M$) which corresponds to the first electrical current; and having a control circuit (3, 4) which is designed to activate the current measuring apparatus for the duration of a measuring period and to deactivate the current measuring apparatus again after the measuring period expires.

11 Claims, 3 Drawing Sheets

(51) Int. Cl.
  *G01R 19/00* (2006.01)
  *H03K 17/082* (2006.01)
  *H03K 17/56* (2006.01)

(58) Field of Classification Search
  USPC .......................................................... 324/126
  See application file for complete search history.

(56) References Cited

U.S. PATENT DOCUMENTS

| | | | | |
|---|---|---|---|---|
| 5,200,878 | A * | 4/1993 | Sasagawa | H03K 17/0828 361/101 |
| 5,500,619 | A * | 3/1996 | Miyasaka | H03K 17/08128 327/427 |
| 5,710,508 | A * | 1/1998 | Watanabe | H03K 17/0828 323/284 |
| 5,877,617 | A * | 3/1999 | Ueda | G05F 3/247 323/315 |
| 6,054,890 | A * | 4/2000 | Giacomo | H03K 17/0828 327/375 |
| 6,097,582 | A * | 8/2000 | John | H03K 17/165 361/79 |
| 6,194,884 | B1 * | 2/2001 | Kesler | G05F 3/222 323/285 |
| 6,633,473 | B1 * | 10/2003 | Tomomatsu | H01L 29/7395 257/E29.198 |
| 6,717,785 | B2 * | 4/2004 | Fukuda | H03K 17/0828 361/86 |
| 6,867,986 | B2 * | 3/2005 | Amei | H02M 3/33507 363/131 |
| 7,083,391 | B2 * | 8/2006 | Sievert | B60T 8/4059 417/42 |
| 7,265,538 | B2 * | 9/2007 | Micke | G01P 3/44 318/400.13 |
| 8,072,241 | B2 * | 12/2011 | Kouno | H01L 29/7397 326/118 |
| 8,451,023 | B2 * | 5/2013 | Kouno | H01L 29/7397 326/118 |
| 8,497,728 | B2 * | 7/2013 | Mizobe | H02P 29/02 326/83 |
| 8,680,897 | B2 * | 3/2014 | Itou | H03K 17/04126 327/109 |
| 8,749,222 | B2 * | 6/2014 | Williams | H01L 23/49575 324/76.11 |
| 8,879,226 | B2 * | 11/2014 | Esumi | H03K 17/0822 361/93.1 |
| 8,994,438 | B2 * | 3/2015 | Gediga | H03K 17/14 327/108 |
| 9,000,750 | B2 * | 4/2015 | Yu | G01R 11/185 324/105 |
| 9,184,651 | B2 * | 11/2015 | Nguyen | H02M 1/08 |
| 9,300,207 | B2 * | 3/2016 | Kosugi | H02M 1/08 |
| 9,447,767 | B2 * | 9/2016 | Ishii | F02P 11/00 |
| 9,664,713 | B2 * | 5/2017 | Sambucco | G01R 19/0092 |
| 9,722,581 | B2 * | 8/2017 | Zhao | H03K 3/012 |
| 2001/0009494 | A1 * | 7/2001 | Umekawa | H03K 17/0822 361/93.9 |
| 2001/0026429 | A1 * | 10/2001 | Fukuda | H03K 17/0828 361/93.9 |
| 2004/0124831 | A1 * | 7/2004 | Micke | G01P 3/44 324/177 |
| 2004/0126243 | A1 * | 7/2004 | Sievert | B60T 8/4059 417/44.2 |
| 2007/0171590 | A1 * | 7/2007 | Nagata | H02H 3/087 361/93.1 |
| 2007/0263334 | A1 * | 11/2007 | Nishida | H02H 3/087 361/103 |
| 2008/0252284 | A1 * | 10/2008 | Pierret | G01R 19/0092 324/102 |
| 2008/0304197 | A1 * | 12/2008 | Higashi | H03K 17/0822 361/93.7 |
| 2010/0289562 | A1 * | 11/2010 | Kohama | H03K 17/0828 327/541 |
| 2011/0221421 | A1 * | 9/2011 | Williams | G01R 19/0092 324/76.11 |
| 2011/0304941 | A1 * | 12/2011 | Tanimura | H02J 3/14 361/93.9 |
| 2012/0098517 | A1 * | 4/2012 | Esumi | H03K 17/0822 323/311 |
| 2012/0176117 | A1 * | 7/2012 | Watanabe | H03K 17/0822 323/312 |
| 2012/0188001 | A1 * | 7/2012 | Mizobe | H02P 29/02 327/427 |
| 2012/0194226 | A1 * | 8/2012 | Itou | H03K 17/168 327/109 |
| 2013/0009655 | A1 * | 1/2013 | Marten | G01R 1/203 324/713 |
| 2013/0045404 | A1 * | 2/2013 | Shi | G01R 31/3606 429/93 |
| 2013/0152910 | A1 * | 6/2013 | Minoya | F02P 5/15 123/625 |
| 2013/0334567 | A1 * | 12/2013 | Kouno | H01L 29/7397 257/140 |
| 2014/0015005 | A1 * | 1/2014 | Ishii | F02P 11/00 257/139 |
| 2014/0111171 | A1 * | 4/2014 | Kosugi | H02M 1/08 323/271 |
| 2014/0145779 | A1 * | 5/2014 | Gediga | H03K 17/0828 327/378 |
| 2014/0192449 | A1 * | 7/2014 | Shimizu | H03K 17/0828 361/93.1 |
| 2014/0285178 | A1 * | 9/2014 | Williams | H01L 23/49575 324/76.11 |
| 2015/0222171 | A1 * | 8/2015 | Nguyen | H02M 1/08 323/282 |
| 2015/0365083 | A1 * | 12/2015 | Jaeger | H03K 17/687 327/109 |
| 2016/0124027 | A1 * | 5/2016 | Sambucco | G01R 19/0092 324/76.11 |
| 2016/0191021 | A1 * | 6/2016 | Zhao | H03K 17/127 327/109 |
| 2016/0191046 | A1 * | 6/2016 | Zhao | H03K 17/127 327/432 |
| 2016/0276956 | A1 * | 9/2016 | Suzuki | H03K 17/56 |
| 2016/0308526 | A1 * | 10/2016 | Richter | H03K 17/162 |
| 2016/0349289 | A1 * | 12/2016 | Sievert | G01R 19/0092 |
| 2016/0349775 | A1 * | 12/2016 | Sievert | G01R 19/0092 |
| 2016/0356817 | A1 * | 12/2016 | Sievert | G01R 19/0092 |
| 2017/0010318 | A1 * | 1/2017 | Butzmann | H03K 17/18 |
| 2017/0040802 | A1 * | 2/2017 | Hopperdietzel | G01R 15/183 |

FOREIGN PATENT DOCUMENTS

JP  05259853 A * 10/1993
JP  10032476 A *  2/1998

OTHER PUBLICATIONS

Storr, Wayne., Monostable Multivibrator, www.electronics-tutorials.ws, waybackdate of Sep. 23, 2013.*
International Search Report for Application No. PCT/EP2014/078663 dated Mar. 19, 2015 (English Translation, 2 pages).

* cited by examiner

CIRCUIT ARRANGEMENT AND METHOD FOR CURRENT MEASUREMENT

BACKGROUND OF THE INVENTION

The invention relates to circuit arrangement and to a method for current measurement of an electric current in a measurement path which corresponds to an electric current in a power path. In particular, the invention relates to a circuit arrangement and a method for current measurement for transistors having a sense terminal.

Although present invention together with the problem addressed thereby is explained on the basis of an IGBT (insulated-gate bipolar transistor) having a sense terminal, it is also applicable to any other transistors or circuits composed of transistors in which a sense terminal is provided.

The document U.S. Pat. No. 5,877,617 A discloses a circuit arrangement in which a load is supplied with a first current. Said first current is provided via a first transistor in a power path. Furthermore, the circuit arrangement comprises a second transistor, which is connected in parallel with the first transistor and which provides in a measurement path a second current proportional to the first current in the power path. The second current in that case serves for monitoring and evaluation of the current flow through the load.

The document U.S. Pat. No. 5,200,878 A discloses a circuit arrangement comprising an insulated-gate bipolar transistor (IGBT) embodied with an additional sense terminal, which provides a sense current proportional to the emitter current. The ratio of the two currents is approximately constant under specific conditions and depends with sufficient accuracy only on the technical implementation of the transistor. The sense terminal in that case typically serves as a measurement path and the emitter terminal as a power path. On account of the proportionality, the emitter current can be determined in principle by means of the measurement of the sense current. Furthermore, the document describes a drive circuit of the gate electrode of such an IGBT comprising a sense terminal.

Typical circuit arrangements for measuring the sense current provide for the sense current to be evaluated over the entire duration of the switching period of the IGBT. In this case, the components of such a circuit arrangement have to be dimensioned for the maximum duration of the switching period of the IGBT and in particular for the average currents and dropping powers and that occur here. By way of example, this may necessitate a cooling of the components used.

SUMMARY OF THE INVENTION

In accordance with one aspect, the present invention provides a circuit arrangement comprising a switching device designed, for the duration of a switching period to provide a first voltage and a first electric current in a power path and also to provide a second voltage and a second electric current in a measurement path, wherein the first electric current corresponds to the second electric current; comprising a current measuring apparatus arranged in the measurement path and designed to provide an output signal corresponding to the first electric current; and comprising a control circuit designed to activate the current measuring apparatus for the duration of a measurement period and to deactivate it again after the measurement period has elapsed.

In accordance with a further aspect, the present invention provides a method for current measurement of an electric current in a measurement path of a circuit arrangement according to the invention, comprising the following steps of activating the switching device for the duration of a switching period; activating the current measuring apparatus for the duration of a measurement period by means of the control circuit; and outputting an output signal by the current measuring apparatus, said output signal corresponding to the electric current in the measurement path.

One concept of the present invention involves providing a circuit arrangement which limits the temporal duration for which a current in a measurement path which corresponds to a current in a power path is evaluated. This is achieved by a control circuit which activates a current measuring apparatus for the duration of a measurement period and deactivates it again after the measurement period has elapsed.

A considerable advantage of the solution according to the invention is that the circuit elements required for measuring the current in the measurement path are implementable with a significantly smaller design. Since the current in the measurement path flows only for a limited duration, the average power loss is significantly lower than if the current flowed continuously. Furthermore, by limiting the average power loss it is also possible to reduce the associated quantity of heat to be dissipated. Firstly, this enables the circuit arrangement to have a more cost-effective construction that can be configured more simply. In this case, secondly, the lower heating of the circuit arrangement has a positive effect on the lifetime of the circuit arrangement. By way of example, it is thus possible to provide a circuit arrangement for the current measurement of an IGBT which does not have to be dimensioned for the maximum duration of the switching period of the IGBT. The dimensioning of the circuit elements for current measurement is determined rather by the duration of the measurement period.

In accordance with one preferred development, the switching device may comprise a BJT, a MOSFET, a JFET and/or an IGBT. The switching device thus advantageously contains one or more actively switchable semiconductor components such as can be integrated in miniaturized form in large numbers in an individual semiconductor substrate. This may be a BJT (bipolar transistor), a MOSFET (metal oxide semiconductor field effect transistor), a JFET (junction field effect transistor) and/or an IGBT (insulated-gate bipolar transistor) or some other suitable semiconductor switch.

Furthermore, in accordance with one preferred development, the switching device may be embodied in particular as an IGBT having a sense terminal. Such an IGBT has, in addition to gate, collector and emitter terminals, a so-called sense terminal, which provides a current corresponding to the emitter current. The sense terminal can thus advantageously be used for the evaluation of the emitter current and thus form the basis for the regulation of the IGBT.

Preferably, the duration of the measurement period of the current measuring apparatus may be less than the duration of the switching period of the switching device. In particular, the current measurement may be performed over a significantly shorter period of time than the duration of the switching period of the switching device. In many applications it thus suffices to briefly read in the current value only once while the switching device is switched on for significantly longer.

Furthermore, the control circuit activates the current measuring apparatus preferably at the beginning of the switching period of the switching device. This has the advantage that the activation of the current measuring apparatus can be triggered by the activation of the switching device and is thus automatically coupled temporally thereto.

In accordance with a further preferred development, the control circuit may comprise a monostable multivibrator. A monostable multivibrator is an advantageous switching element for activating other switching elements only for a fixedly predefined, limited period of time. A monostable multivibrator is configured such that after activation it remains activated only for a specific period of time.

In accordance with one preferred development, the control circuit may comprise a transistor. The latter may be designed to activate and to deactivate the current measuring apparatus. Furthermore, it may comprise a control terminal that is drivable by the monostable multivibrator. In this advantageous configuration, the transistor serves as an actively switchable element which is switched on and off by the monostable multivibrator for a limited period of time.

In accordance with a further preferred development, the current measuring apparatus may be designed to provide a voltage signal that is proportional to the first current. The provision of a proportional voltage signal at the output of the current measuring apparatus may be implemented particularly simply, for example by incorporating a shunt resistor.

Preferably, the circuit arrangement may further comprise a compensation circuit designed to regulate the ratio of the first voltage and the second voltage of the switching device during the switching period.

Furthermore, the compensation circuit may preferably comprise an operational amplifier. The latter may be designed to regulate the first voltage and the second voltage of the switching device by negative feedback. The use of an operational amplifier with negative feedback is a frequently used and effective solution for actively regulating the ratio of two voltages.

BRIEF DESCRIPTION OF THE DRAWINGS

Further features and advantages of the present invention are explained below on the basis of embodiments with reference to the figures.

In the figures.

DETAILED DESCRIPTION

In the figures, identical reference signs designate identical or functionally identical elements.

Figure 1:
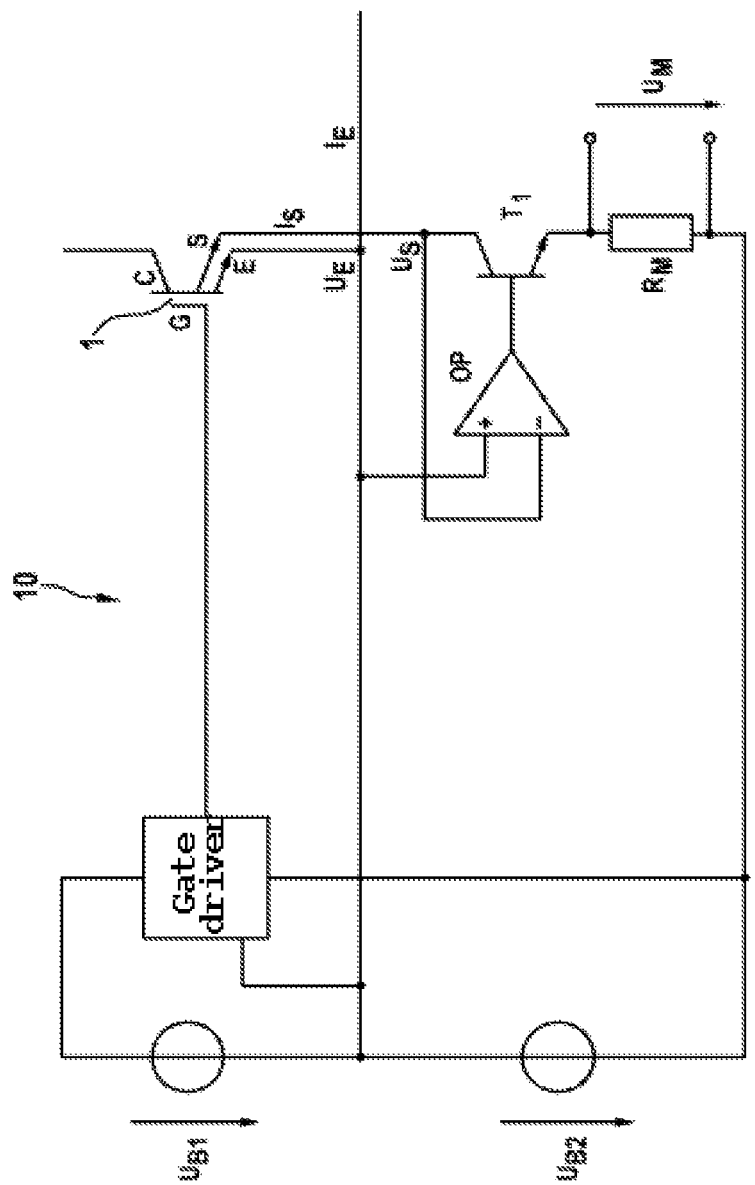
FIG. 1 shows a schematic illustration of a circuit diagram for one exemplary circuit arrangement for current measurement in the case of an IGBT.

FIG. 1 shows a schematic illustration of a circuit diagram for one exemplary circuit arrangement for current measurements in the case of an IGBT.

In FIG. 1, reference sign 10 denotes the circuit arrangement and reference sign 1 denotes the IGBT comprising a gate terminal G, a collector terminal C, an emitter terminal E and a sense terminal S. The IGBT 1 is driven by a drive circuit with supply voltages $U_{B1}$ and $U_{B2}$ via the gate terminal G. The IGBT provides an emitter current $I_E$ in a power path and a sensor current $I_S$ proportional thereto in a measurement path, and also an emitter voltage $U_E$ and a sense voltage $U_S$. The ratio of the two currents is approximately constant under specific conditions and depends with sufficient accuracy only on the technical implementation of the transistor 1. In this case, the sense terminal serves as a measurement path and the emitter terminal serves as a power path. On account of the proportionality, the emitter current $I_E$ can be determined by means of the measurement of the sensor current $I_S$ as long as the boundary conditions are the same for measurement and power paths. Possible influences resulting from production and temperature are minimized by the integration of the circuit on an individual semiconductor substrate. In general, however, the emitter current $I_E$ is dependent nonlinearly on the emitter voltage $U_E$ such that the ratio of the two currents is approximately constant only if the emitter voltage $U_E$ and the sense voltage $U_S$ are identical.

FIG. 1 furthermore shows a measuring resistor $R_M$ designed for measuring $I_S$. Owing to the voltage drop $U_M$ in the measuring resistor $R_M$, it is necessary for a compensation circuit to keep emitter voltage $U_E$ and sense voltage $U_S$ at the same level. For this purpose, the compensation circuit contains inter alia a transistor $T_1$ and an operation amplifier OP connected thereto, the two voltages $U_E$, $U_S$ being applied to the two inputs of said creational amplifier. Furthermore, the negative supply voltage $U_{B2}$ ensures that sense terminal S and emitter terminal E are at the same potential despite the measuring resistor $R_M$.

In this case, the circuit arrangement 10 in FIG. 1 has to be dimensioned for the maximum duration of the switching period of the IGBT 1 and in particular for the average currents and dropping power losses that occur here.

Figure 2:
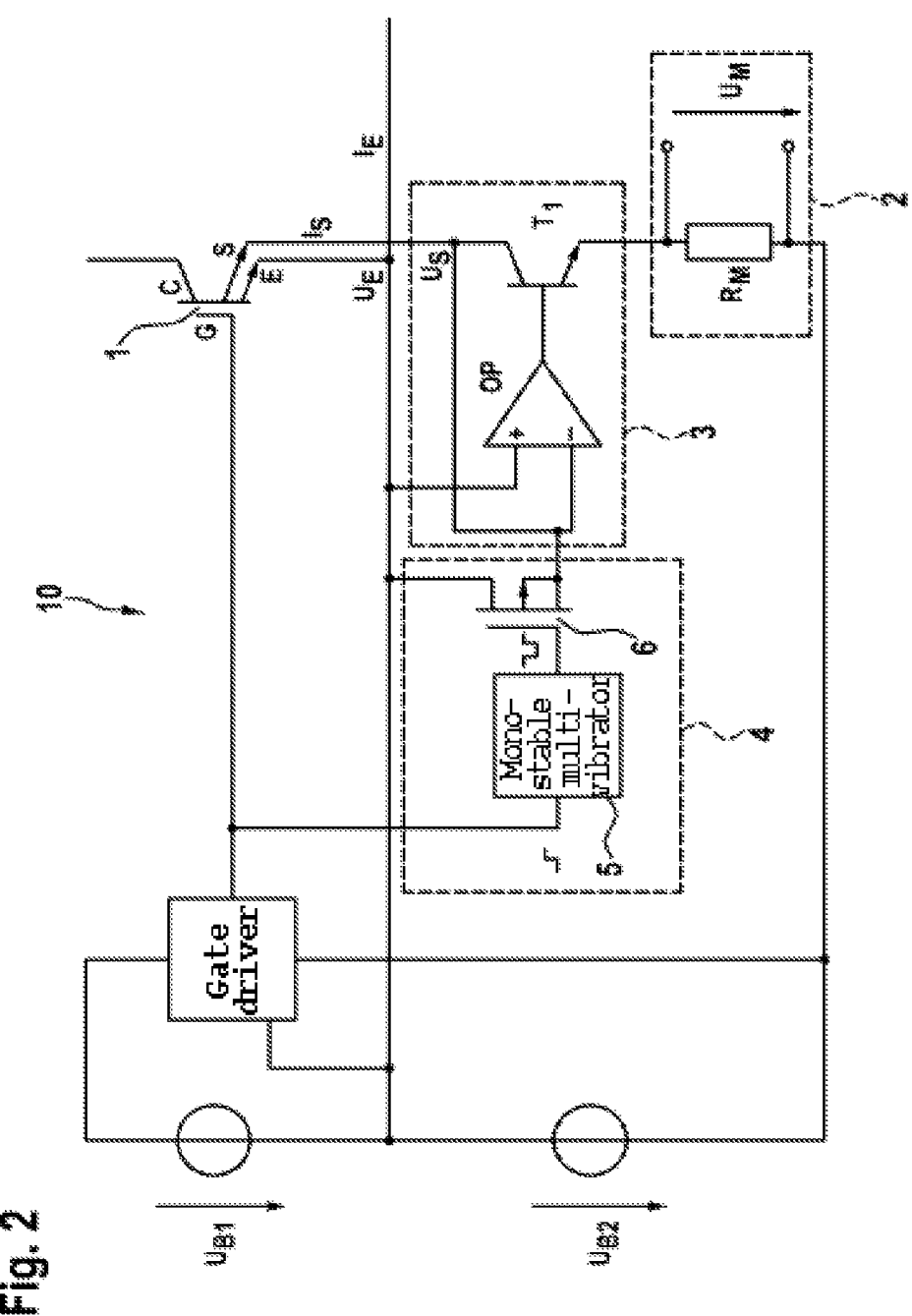
FIG. 2 shows a schematic illustration of a circuit diagram for a circuit arrangement for current measurement in the case of an IGBT in accordance with one embodiment of the invention.

FIG. 2 shows a schematic illustration of a circuit diagram for a circuit arrangement for current measurement in the case of an IGBT in accordance with one embodiment of the invention.

In FIG. 2, the reference sign 10 denotes the circuit arrangement. The latter comprises inter alia an IGBT 1 having a gate terminal G, a collector terminal C, an emitter terminal E and a sense terminal S, wherein the IGBT 1 is driven with supply voltages $U_{B1}$ and $U_{B2}$ by a drive circuit via the gate terminal G. The IGBT 1 provides an electric current $I_S$ in a measurement path with a sense voltage $U_S$ and also an electric current $I_E$ in a power path with an emitter voltage $U_E$. Furthermore, the circuit arrangement 10 comprises a current measuring apparatus 2, a compensation circuit 3 and a control circuit 4. The current measuring apparatus consists of a shunt resistor $R_M$ with a voltage $U_M$ dropped across the latter. A compensation circuit 3 comprising an operational amplifier OP and a transistor $T_1$ is interposed between the current measuring apparatus 2 and the IGBT 1. Connected upstream of the compensation circuit 3 is a control circuit 4 comprising a monostable multivibrator 5, to the output of which a further transistor 6 is connected, which for its part is in turn connected to the negative input of the operational amplifier OP.

The electric current $I_S$ in the measurement path corresponds to the electric current $I_E$ in the power path and can thus be used for determining the current $I_E$ in the power path. Given identical boundary conditions for the two currents or for measurement path and power path, the two currents are in particular proportional to one another with an approximately constant proportionality factor. On account of the nonlinear dependence of $I_E$ and $U_E$, however the two voltages must be of identical magnitude in order that a constant ratio of the two currents is ensured. In order to ensure these identical voltage ratios at the emitter terminal E and at the sense terminal S of the IGBT 1, the circuit arrangement 10 comprises the compensation circuit 3. In the embodiment illustrated in FIG. 2, the compensation circuit 3 contains for this purpose an operational amplifier OP, for example, to the two inputs of which the two voltages $U_S$ and $U_E$ are respectively applied in a manner exhibiting negative feedback In this case, the measurement of the electric current $I_S$ in the measurement path is carried out by the current measuring apparatus 2. In this case, the current $I_S$ flows firstly through the transistor $T_1$ and then through the shunt resistor $R_M$. In this case, a voltage $U_M$ proportional to the current flowing through the shunt resistor $R_M$ is dropped across said resistor. A voltage signal can be obtained therefrom, which can then be converted into a digital signal for further processing, for example by means of an analogue-to-digital converter (ADC). In this regard, an ADC, at specific clock intervals, for example, can instigate the read-out of the voltage signal and thus a measurement of the current $I_E$ in the power path. The voltage drop $U_M$ in the shunt resistor $R_M$ necessitates that the compensation circuit be supported electrically at a lower potential relative to the emitter terminal E of the IGBT 1. This is achieved by the supply voltage $U_{B2}$ being set to be negative.

The IGBT 1 is switched on for the duration of a switching period $T_B$. In this period of time, the current measuring apparatus 2 is activated for a time period $T_M$. The circuit arrangement 10 in FIG. 2 furthermore contains a control circuit 4 designed to activate the current measuring apparatus 2 and to deactivate it again after the measurement period $T_M$ has elapsed. For this purpose, the control circuit 4 comprises a monostable multivibrator 5, the output of which is connected to the gate terminal of a transistor 6. The transistor 6 is in turn connected to one of the inputs of the operational amplifier OP. In this embodiment, the activation signal for the monostable multivibrator 5 is implemented simultaneously with the activation signal of the IGBT 1. The monostable multivibrator 5 turns off the transistor 6 in turn for the duration of its activation. The transistor 6 is connected to the inputs of the operational amplifier OP such that the latter is short-circuited as long as the transistor 6 is not turned off, i.e. as long as the transistor 6 is switched on. As a result of the short-circuiting of the two inputs of the operational amplifier OP, the latter no longer generates an output voltage, such that a base current no longer flows through the transistor $T_1$, the latter is thus turned off and, consequently, no current flows through the current measuring apparatus 2 either. In this embodiment, the activation duration of the monostable multivibrator 5 corresponds to the measurement period $T_M$. In this embodiment, therefore, the measurement period $T_M$ is triggered by the beginning of the switching period $T_B$ of the IGBT 1 by virtue of the monostable multivibrator 5 being activated. Furthermore, in this embodiment it is provided that the duration of the measurement period $T_M$ is less than the duration of the switching period $T_B$. As a result, therefore, firstly the duration of the current measurement is limited. Secondly, the sampling instant for the current measurement of the IGBT 1 is thereby positioned at the start of the switching period $T_B$ of the IGBT 1. By way of example, an ADC can thus read in the present current value once per clock period, without the compensation circuit 3 and the current measuring apparatus 2 having to be active during the entire drive time of the IGBT 1. The activation signal of the IGBT 1 is additionally used as a trigger for the current measurement. Furthermore, it is provided that the reading-in of the current value by the ADC is likewise synchronized by the activation signal of the IGBT 1. By way of example, the reading-in of the ADC may be positioned shortly before the end of the measurement period $T_M$, such that the current to be measured has reliably arrived at a constant value after the switch-on phase of the IGBT 1, the compensation circuit 3 and the current measuring apparatus 2. As a result of the limited activation duration of the compensation circuit 3 and the current measuring apparatus 2, the average power loss across the shunt resistor $R_M$ and the transistor $T_1$ is greatly reduced compared with a circuit arrangement in which the current measuring apparatus 2 is activated during the entire switching period $T_B$ of the IGBT 1. The same applies to the average current of the supply voltage $U_{B2}$. What is thus achieved as a result is that the circuit arrangement 10 is implementable in a smaller design and therefore may be configured significantly more cost-effectively and more simply.

The embodiment illustrated in FIG. 2 should be regarded as by way of example. Although the present invention is implemented here with an IGBT comprising a sense terminal, it is also applicable to any other transistors or circuits composed of transistors in which a sense terminal is provided or in which a current in a measurement path is provided which corresponds to a current in a power path. The incorporated transistors may be BJTs, MOSFETs, JFETs and/or IGBTs. Furthermore, other switching devices and semiconductor switches are also provided. The technologies mentioned above are also provided for the two transistors $T_1$ and 6. Furthermore, the transistor 6 may also be incorporated elsewhere into the circuit arrangement for deactivating the current measuring apparatus as long as a switching element is present which ensures that the transistor $T_1$ is turned off for the duration of the measurement period $T_M$.

Figure 3A:
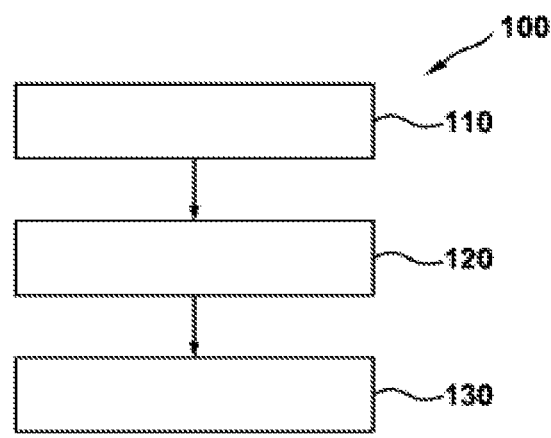
FIG. 3a shows a schematic illustration of a flow diagram for a method for current measurement in the case of an IGBT in accordance with a further embodiment of the invention.

FIG. 3a shows a schematic illustration of a flow diagram for a method for current measurement in the case of an IGBT in accordance with a further embodiment of the invention.

The method shown in FIG. 3a serves for the current measurement of an electric current $I_S$ in a measurement path which corresponds to an electric current $I_E$ in a power path. By way of example, this method may be used for the embodiment of the circuit arrangement 10 as illustrated in FIG. 2.

In FIG. 3a, reference sign 100 denotes the method for current measurement. Said method comprises the steps of activating 110 the switching device 1 for the duration of a switching period $T_B$, activating 120 the current measuring apparatus 2 for the duration of a measurement period $T_M$ by means of the control circuit 4 and outputting 130 an output signal by the current measuring apparatus 2, said output signal corresponding to the electric current $I_S$ in the measurement path.

Figure 3B:
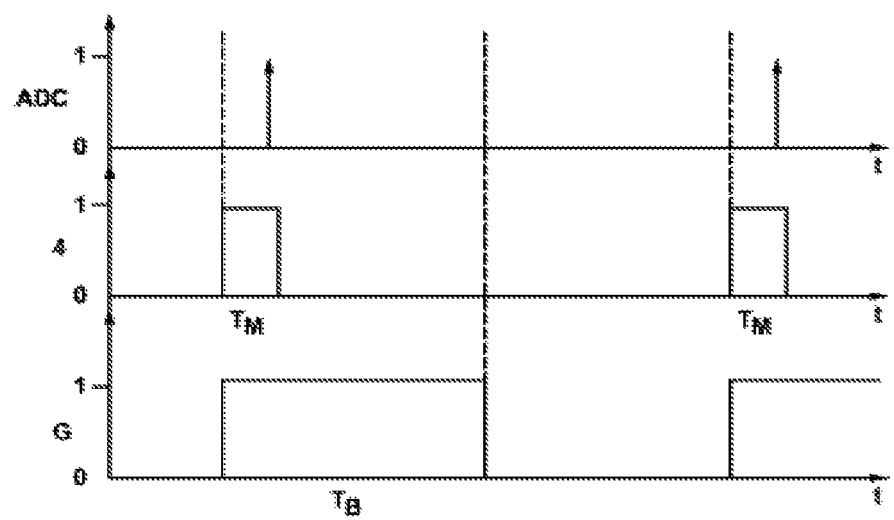
FIG. 3b shows a timing diagram of drive signals of a method for current measurement in the case of an IGBT in accordance with a further embodiment of the invention.

FIG. 3b shows a timing diagram of drive signals of a method for current measurement in the case of an IGBT in accordance with a further embodiment of the invention.

The timing diagram of drive signals depicted in FIG. 3b constitutes a concrete embodiment of the method shown schematically in FIG. 3a. By way of example, the circuit arrangement 10 shown in FIG. 2 may be operated with the method in FIG. 3a or with the drive signals in FIG. 3b. The method from FIG. 3a and FIG. 3b is explained below by way of example on the basis of the circuit arrangement 10 from FIG. 2.

FIG. 3b illustrates the activation signals of three components as function of time. The switching period $T_B$ of the IGBT 1 is depicted at the bottom. The state of the current measuring apparatus 2 is shown in the middle. Said current measuring apparatus is switched on for the duration of a measurement period $T_M$, wherein the measurement period $T_M$ is significantly shorter than the switching period $T_B$ of the IGBT 1. By way of example, the switching period $T_B$ may be provided in the range of 50 µs to 100 µs, while the measurement period $T_M$ lasts only approximately 10 µs to 15 µs. At the top the diagram shows by way of example the sampling instant of an ADC which reads out the current $I_S$ of the IGBT 1 once per clock period. The measurement period $T_M$ is started simultaneously with the switching period $T_B$. By contrast, the sampling instant of the ADC is positioned shortly before the end of the measurement period $T_M$ in order that the current $I_S$ can be measured as accurately as possible and is not influenced by switch-on processes of the IGBT. The clock period of the circuit arrangement 10 may be 100 µs, for example, that is to say that the IGBT 1 is switched on and off with a frequency of 10 kHz, and the ADC correspondingly also reads in the current values with a frequency of 10 kHz. The values and sequences indicated should be regarded by way of example. In principle, other embodiments are also provided which ensure that the current in the measurement path is evaluated only during a limited period of time and that the measurement is furthermore positionable at the start of the switching period $T_B$ of the IGBT 1.

The invention claimed is:
1. A circuit arrangement comprising:
   a switching device (1) configured, for the duration of a switching period ($T_B$), to provide a first voltage ($U_E$) and a first electric current ($I_E$) in a power path and also to provide a second voltage ($U_S$) and a second electric current ($I_S$) in a measurement path, wherein the second electric current ($I_S$) corresponds to the first electric current ($I_E$);
   a current measuring apparatus (2) arranged in the measurement path and configured to provide an output signal corresponding to the second electric current ($I_S$); and
   a control circuit (4) configured to turn on the current measuring apparatus (2) for the duration of a measurement period ($T_M$) and to turn off the current measuring apparatus (2) again after the measurement period ($T_M$) has elapsed.
2. The circuit arrangement as claimed in claim 1, wherein the switching device (1) comprises a BJT, a MOSFET, a JFET and/or an IGBT.
3. The circuit arrangement as claimed in claim 2, wherein the switching device (1) is embodied as an IGBT having a sense terminal.
4. The circuit arrangement as claimed in claim 1, wherein the duration of the measurement period ($T_M$) of the current measuring apparatus (2) is less than the duration of the switching period ($T_B$) of the switching device (1).
5. The circuit arrangement as claimed in claim 1, wherein the control circuit (4) activates the current measuring apparatus (2) at the beginning of the switching period ($T_B$) of the switching device (1).
6. The circuit arrangement as claimed in claim 1, wherein the control circuit (4) comprises a monostable multivibrator (5).
7. The circuit arrangement as claimed in claim 6, wherein the control circuit (4) comprises a transistor (6) configured to activate and to deactivate the current measuring apparatus (2) and including a control terminal drivable by the monostable multivibrator (5).
8. The circuit arrangement as claimed in claim 1, wherein the current measuring apparatus (2) is configured to provide a voltage signal ($U_M$) that is proportional to the first electric current ($I_E$).
9. The circuit arrangement as claimed in claim 1, furthermore comprising:
   a compensation circuit (3) configured to regulate the ratio of the first voltage ($U_E$) and the second voltage ($U_S$) of the switching device during the switching period ($T_B$).
10. The circuit arrangement as claimed in claim 9, wherein the compensation circuit (3) includes an operational amplifier (OP) configured to regulate the first voltage ($U_E$) and the second voltage ($U_S$) of the switching device (1) by negative feedback.
11. A method for current measurement of an electric current in a measurement path of a circuit arrangement as claimed in claim 1, comprising the following steps:
   activating (110) the switching device (1) for the duration of a switching period ($T_B$);
   turning on (120) the current measuring apparatus (2) for the duration of a measurement period ($T_M$) by the control circuit (4);
   turning off the current measuring apparatus (2) following the measurement period ($T_M$) by the control circuit (4); and
   outputting (130) an output signal by the current measuring apparatus (2),
   said output signal corresponding to the second electric current ($I_S$) in the measurement path.

* * * * *